(12) United States Patent
Geltinger et al.

(10) Patent No.: US 8,154,356 B2
(45) Date of Patent: Apr. 10, 2012

(54) OSCILLATOR WITH CAPACITANCE ARRAY

(75) Inventors: Hans Geltinger, Schliersee (DE);
Thomas Gustedt, Zusmarshausen (DE);
Andreas Roithmeier, Munich (DE);
Thomas Mayer, Linz (AT)

(73) Assignee: Infineon Technologies AG, Neubiberg (DE)

( * ) Notice: Subject to any disclaimer, the term of this patent is extended or adjusted under 35 U.S.C. 154(b) by 59 days.

(21) Appl. No.: 12/642,800

(22) Filed: Dec. 19, 2009

(65) Prior Publication Data

US 2011/0148530 A1 Jun. 23, 2011

(51) Int. Cl.
*H03B 5/08* (2006.01)
*H03B 5/12* (2006.01)
*H03L 7/099* (2006.01)

(52) U.S. Cl. ....... 331/179; 331/25; 331/117 R; 331/168; 331/175

(58) Field of Classification Search .......... 331/8, 16–18, 331/25, 116 R, 116 FE, 117 R, 117 FE, 117 D, 331/168, 175, 177 R, 177 V, 179
See application file for complete search history.

(56) References Cited

U.S. PATENT DOCUMENTS

| 6,747,522 B2 * | 6/2004 | Pietruszynski et al. ... 331/177 R |
| 6,870,434 B2 * | 3/2005 | Han et al. ...................... 331/158 |
| 7,371,005 B1 * | 5/2008 | Ahuja et al. ................... 368/202 |
| 2010/0283551 A1 * | 11/2010 | Zeng et al. ............. 331/117 FE |

FOREIGN PATENT DOCUMENTS

DE 102 55 145 B4 6/2004

OTHER PUBLICATIONS

Christian Mayer et al. A Robust GSM/EDGE Transmitter Using Polar Modulation Techniques, Oct. 3-4, 2005, 93-96, The European Conference on Wireless Technology, 2005, Paris, France.

* cited by examiner

*Primary Examiner* — David Mis
(74) *Attorney, Agent, or Firm* — SpryIP, LLC

(57) ABSTRACT

An oscillator is provided which comprises an array of capacitances. At least some capacitances in the array have different capacitance values.

11 Claims, 4 Drawing Sheets scaled

OSCILLATOR WITH CAPACITANCE ARRAY

FIELD OF THE INVENTION

The present invention relates to oscillators with capacitor arrays.

BACKGROUND

The frequency of an electronic oscillator is generally determined by its inductance and capacitance. In some oscillators, capacitor arrays comprising a plurality of unit capacitances are provided. Depending on a control input of the oscillator, these capacitances of the capacitance array are selectively activated and deactivated to change the frequency of a signal generated by the oscillator.

For example, in so-called digital controlled oscillator using thermometer decoding, a capacitance array comprises a plurality of capacitances with nominally equal capacitance values. A number of capacitances corresponding to a number represented by the digital control word is activated. Such a control scheme leads to a non-linear dependency of the frequency from the control word.

SUMMARY OF THE INVENTION

According to an embodiment, an oscillator is provided, comprising:
an array of capacitances, and
a thermometer decoder coupled to said array of capacitances, wherein at least some capacitances of the array of capacitances have different capacitance values.

It should be noted that the above summary is only intended to give a brief overview of some features of some embodiments of the present invention. However, the above features are not to be construed as being essential for practicing the present invention, as other embodiments may comprise different features than the ones mentioned above.

DETAILED DESCRIPTION OF THE INVENTION

Figure 1:
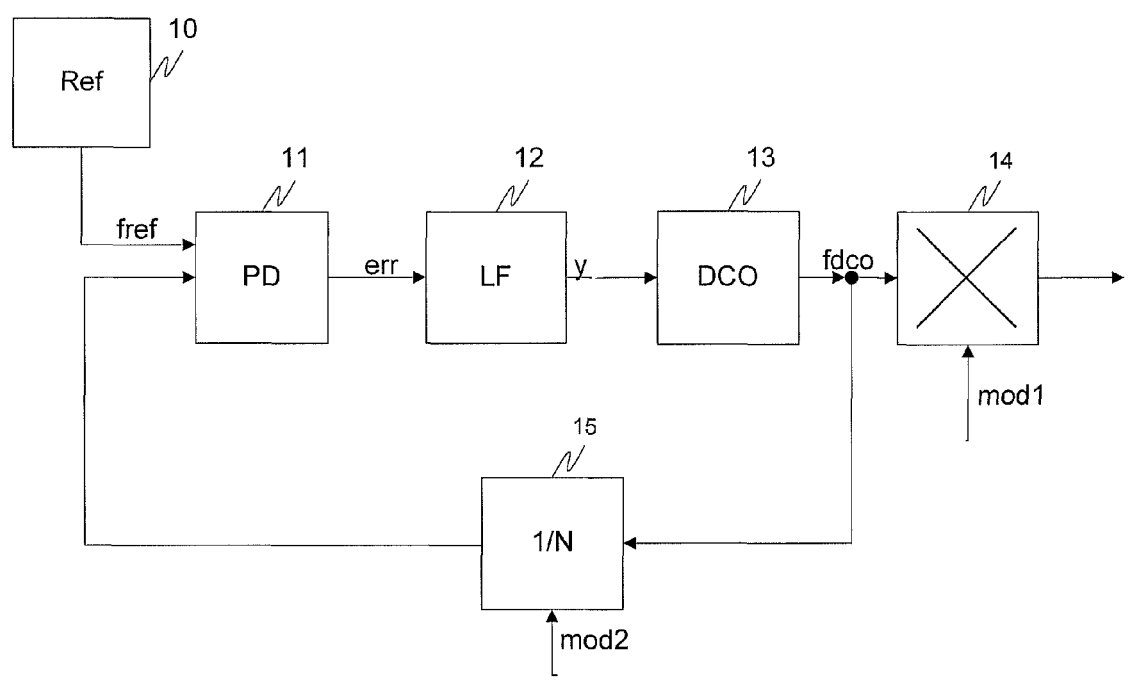
FIG. 1 shows a block diagram of a phase locked loop comprising an oscillator according to an embodiment.

In the following, some embodiments of the present invention will be described in detail. It is to be understood that the following description is given only for the purpose of illustration and is not to be taken in a limiting sense. The scope of the invention is not intended to be limited by the embodiments described hereinafter with reference to the accompanying drawings, but is intended to be limited only by the appended claims and equivalents thereof.

It is also to be understood that in the following description of embodiments any direct connection or coupling between functional blocks, devices, components, circuit elements or other physical or functional units shown in the drawings or described herein could also be implemented by an indirect connection or coupling, i.e. a connection or coupling comprising one or more intervening elements. Furthermore, it should be appreciated that functional blocks or units shown in the drawings may be implemented as separate circuits in some embodiments, but may also be fully or partially implemented in common circuits or common devices in other embodiments. In other words, the functional blocks are provided to give a clear understanding of various functions performed and are not to be construed as necessarily indicating separate physical entities.

It should be noted that the drawings are provided to give an illustration of some aspects of embodiments of the present invention and are therefore to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative location of the various components in implementations according to embodiments of the present invention unless noted to the contrary.

The features of the various embodiments described herein may be combined with each other unless specifically noted otherwise. On the other hand, describing an embodiment with a plurality of features is not to be construed as indicating that all those features are necessary for practicing the present invention, as other embodiments may comprise less features and/or alternative features.

In the following, some embodiments of controllable oscillators are described. Controllable oscillators in the context of this application are oscillators which output an output signal having an output frequency, which output frequency can be controlled via a control input of the controllable oscillator. One type of controllable oscillators described in more detail in the following is a digitally controlled oscillator (DCO), where the output frequency is controlled via a digital control input. Other types of controllable oscillators comprise voltage controlled oscillators (VCO). It should be noted that a digitally controlled oscillator may be "converted" to a voltage controlled oscillator by adding an analog-to-digital converter which converts a control voltage into a digital control word. Therefore, the techniques described in the following for digitally controlled oscillators may also be employed for other types of controlled oscillators, e.g. by using appropriate converters.

Controlled oscillators like digitally controlled oscillators are often employed in phase locked loops. FIG. 1 shows a simple example for a phase locked loop according to an embodiment in which a digitally controlled oscillator 13 according to an embodiment of the present invention may be used.

The digitally controlled oscillator 13 outputs an output signal with an output frequency fdco. The output signal is fed to a frequency divider 15, for example a multi-modulus divider, and the thus frequency divided signal is fed to an input of a phase detector 11. A reference signal with a frequency fref generated by a reference clock 10, for example a crystal oscillator, is fed to a further input of phase detector 11. Phase detector 11 in the embodiment of FIG. 1 outputs an error signal err which indicates a phase difference between the reference signal and the output signal of frequency divider 15. This signal err is filtered by a loop filter 12 to obtain a digital control signal, also referred to as digital control word, y which controls the output frequency of digitally controlled oscillator 13.

With such a loop, the frequency of the output signal of frequency divider 15 is regulated to the frequency fref or, in other words, the output frequency fdco of digitally controlled oscillator 13 is regulated to a frequency N times the frequency of fref if frequency divider 15 divides the frequency by N.

Such phase locked loops may for example be employed in transmitters, for example wireless transmitters. In this case, the output signal is modulated based on data or signals, for example base band signals, to be transmitted. For example, the output signal of the oscillator 13 may be fed to a mixer 14 and modulated, in this case mixed, with a first modulation signal mod1. Additionally or alternatively, the divider 15 may be modulated with a second modulation signal mod2. In an application of so-called polar modulation, for example first modulation signal mod1 may represent the amplitude and second modulation signal mod2 the phase of a signal with which the output signal is to be modulated.

It should be noted that FIG. 1 shows only a simple scheme of a PLL to illustrate environments in which controlled oscillators according to some embodiments of the present invention may be used. VARiations to this PLL or additional elements are possible. For example, a so-called pre-emphasis of a modulation signal used may be performed, or the device may be adapted for so-called two point modulation. Also, the employment of oscillators of embodiments of the present invention is not limited to PLLs, but such oscillators can generally be used for applications where a controllable frequency is to be produced.

For some applications, for example the above-mentioned modulation scheme, it is desirable to know the so-called oscillator gain. Generally, the oscillator gain characterizes a change of frequency depending on a change of the control word. This will be illustrated with reference to FIG. 2.

Figure 2:
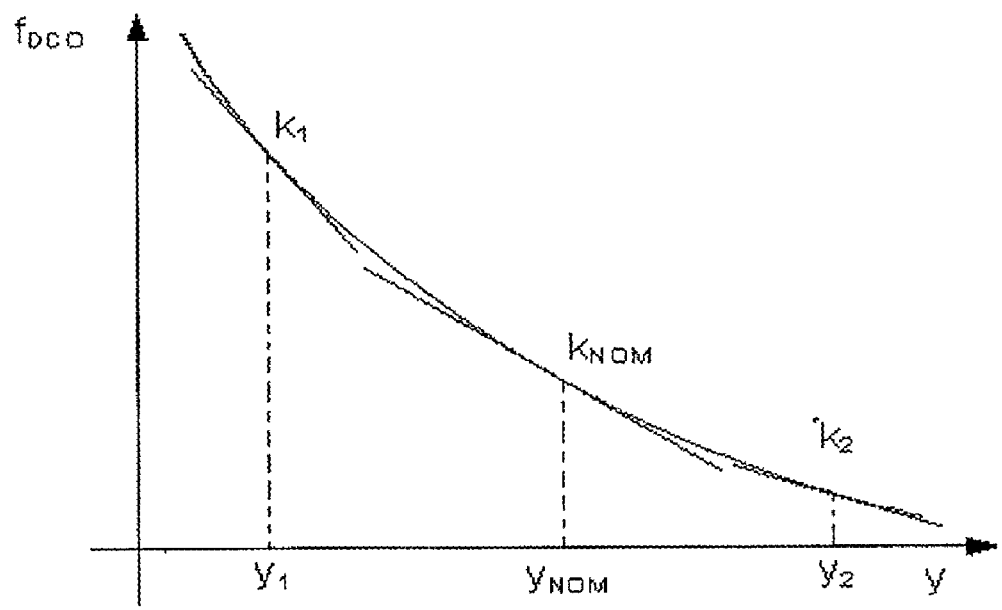
FIG. 2 shows a diagram for explaining some terms used in the present application.

In FIG. 2, an example for a frequency of an output signal fdco depending on the control word y is shown. It should be noted that the graph of FIG. 2 is merely used to explain the terminology used and is not to be construed as being the actual output function of an oscillator according to an embodiment of the present invention.

The oscillator gain k in FIG. 2 basically corresponds to the slope of the curve, as indicated by tangents for three different control words $y_1$, $y_{NOM}$ and $y_2$. In the example of FIG. 2, the curve is non-linear, which leads to a changing oscillator gain from $k_1$ via $k_{NOM}$ to $k_2$.

A non-linear curve similar to the one shown in FIG. 2 may for example be obtained by employing a capacitance array with a plurality of unit capacitances of equal values in an LC resonance circuit of a digitally controlled oscillator, wherein a number of activated capacitances corresponds to a value of all or part of the control word. In such a case, the frequency fdco in a simple model is given by:

$$fdco = \frac{1}{2\pi\sqrt{L(C_{FIX} + C_{VAR}(y))}} \quad (1)$$

wherein L is the inductance of the LC resonance circuit, $C_{FIX}$ is a constant capacitance, $C_{VAR}$ is the capacitance value of one unit capacitance of the above-mentioned array and y is the decimal value of the digital control word, i.e. for constant unit capacitances the overall capacitance is $C_{FIX}+y \cdot C_{VAR}$.

As can be easily seen from equation (1) for constant values of $C_{VAR}$ the relationship between the frequency fdco and the digital control word y is non-linear.

In some embodiments of the present invention, an oscillator with an array of capacitances is provided which is generally controlled as described above, i.e. a number of activated capacitances is determined by a value of a digital control word or part thereof, wherein at least some of the capacitances have unequal capacitance values. In some embodiments, the capacitance values compared to constant capacitance values are modified to increase the linearity of the relationship between digital control word and output frequency compared to equation (1).

Figure 3:
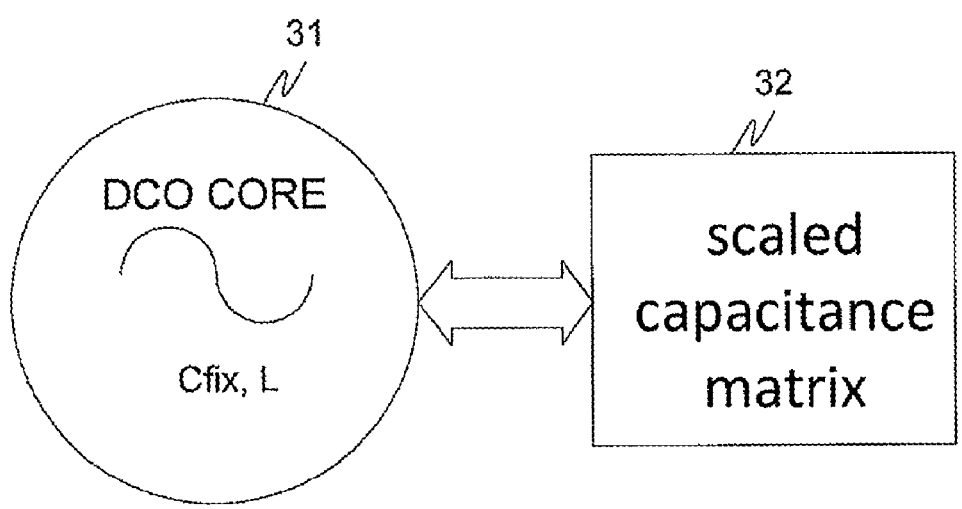
FIG. 3 shows a block diagram of an oscillator according to an embodiment.

In FIG. 3, a corresponding embodiment of a digitally controlled oscillator is schematically shown. The embodiment of FIG. 3 comprises a portion labeled DCO core 31 and a scaled capacitor matrix 32. DCO core 31 comprises for example a fixed capacitance $C_{FIX}$, an inductance L, and an input for a digital control signal. Scaled capacitance matrix 32 comprises an array of capacitances which are selectively activated depending on a digital control signal input to the digitally controlled oscillator of FIG. 3. Scaled in this respect indicates that at least not all the capacitances are equal, but that different capacitance values for the capacitances in the array are used to obtain a behavior which is at least more linear than the behavior described by equation (1).

In other words, in an embodiment the capacitances of a capacitance array are modified such that a relationship $$fdco \sim f_{FIX} + k_{NOM} \cdot y \quad (2)$$

is at least approximated. $f_{fix}$ is a fixed frequency which is for example in the embodiment of FIG. 3 determined by L and $C_{FIX}$, i.e. corresponds to the frequency when none of the capacitances of the scale capacitance matrix 32 is activated. $k_{NOM}$ is the nominal oscillator gain. For a linear relationship, as can be seen from FIG. 2, k is constant.

It should be noted that while in some embodiments equation (2) may be realized rather precisely, in other embodiments this relationship is only approximated, for example due to technological restraints or due to less stringent requirements on the linearity which does not require an exact behavior as in equation (2).

Figure 4:
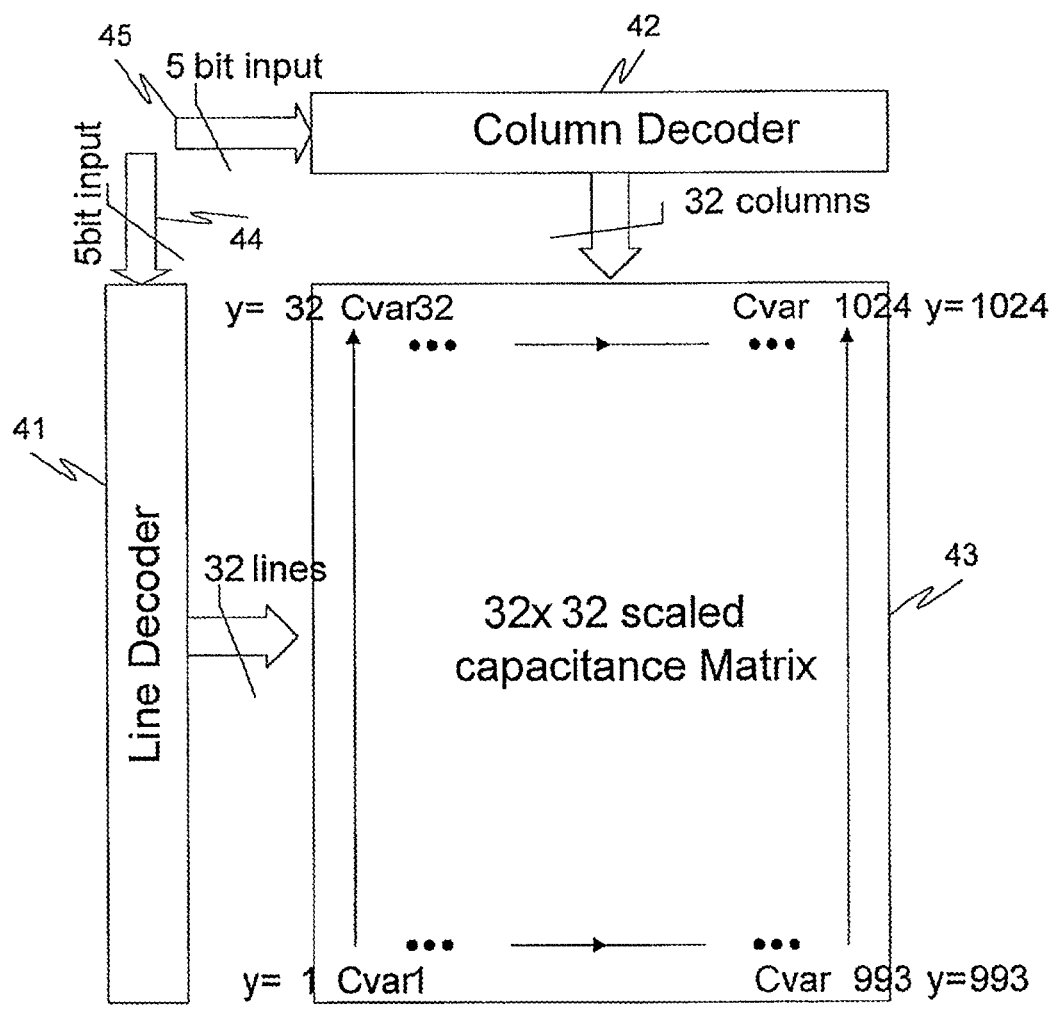
FIG. 4 shows a block diagram of a portion of an oscillator according to an embodiment.

An embodiment of a scaled capacitance matrix is shown in FIG. 4. The arrangement of FIG. 4 is an example for scaled capacitance matrix 32 of FIG. 3. However, it is to be noted that FIG. 4 is only an example to further explain some features of some embodiments and is not to be construed as limiting.

In FIG. 4, individual capacitances labeled $C_{VAR1}$ to $C_{VAR1024}$ are arranged in a 32 times 32 matrix, i.e. altogether 1024 capacitances are arranged in the matrix. The arrangement and number of capacitances is merely an example and depends for example on the desired resolution and/or tuning range of the digitally controlled oscillator.

The capacitance matrix of FIG. 4 is controlled by a thermometer decoder comprising a line decoder 41 and a column decoder 42. Line decoder 41 is fed five input bits via an input 44, and column decoder 42 is also fed five inputs bits via an input 45. For example, the five input bits fed to line decoder 41 may be the lower five bits of a ten bit control word y, and the five bits fed to column decoder 42 may be the higher five bits of a ten bit digital control word.

In the arrangement of FIG. 4, for a control word y=1 only $C_{VAR1}$ is activated, and then the capacitances of the first (in FIG. 4 leftmost) column are activated until at y=32 all 32 capacitances of the first row are activated. Then, with each rise of the control word by one bit, the capacitances of the next column are activated until for y=1024 all capacitances are activated. A disabling of capacitances when lowering the value of the control word works in the reversed order in the embodiment of FIG. 4. However, in other embodiments other orders for activating the capacitances may be used, for example the roles of rows and columns may be reversed.

In an embodiment, the capacitances CVAR1 to CVAR102₄ are chosen such that the oscillator gain is constant or approximately constant. The oscillator gain is proportional to the derivation of equation (1) to $C_{VAR}(y)$, which is equal to $$-\frac{L}{4\pi(L \cdot (C_{FIX} + C_{VAR}(y)))^{\frac{3}{2}}} \quad (3)$$

In other words, to obtain constant gain $C_{VAR(y)}$ has to be chosen such that term (3) is constant.

An approximation of such a behavior may be obtained by a linear scaling of the capacitances $C_{VAR}$, for example according to $$C_{VAR}(x+1) = C_{VARx} + \Delta C_{VAR} \quad (4)$$

wherein $\Delta C_{var}$ is a predetermined capacitance step between two adjacent capacitances, for example $C_{VAR2}$ and $C_{VAR1}$, and $C_{VAR1}$ is set to a predetermined minimum capacitance $C_{VARmin}$. x is the number of the capacitance In this case, $C_{VAR1}$ has the smallest capacitance values of the capacitances of the capacitance matrix, and in the example of FIG. 4 $C_{VAR1024}$ has the largest value, which also may be referred to as $C_{VARmax}$.

It should be noted that equation (4) may also be written as $$C_{VARx} = C_{VAR1} + (x-1) \cdot \Delta C_{VAR} \quad (5)$$

$\Delta C_{var}$, is then chosen to approximate a linear relationship between fdco and the control word y.

The above equations (4) and (5) correspond to a linear scaling of the capacitance values. For a finer approximation of a linear behavior, also a higher order scaling, for example a cubic scaling or a quadratic scaling, may be used. In other words, the behavior of $C_{VAR}$ determined by the requirement that term (3) is a constant may be approximated by a linear, a quadratic, a cubic or a higher order approximation. In still other embodiments, the values of $C_{VAR}$ may be individually calculated based on term (3).

On the other hand, a somewhat coarser approximation would be reached if not every capacitance of the capacitance array is modified, for example by equation (4), but if only every $Nv^{th}$, for example every fifth or every tenth element, a change of the capacitance is performed. For example, in this case every ten capacitances the capacitance value may be increased by $10\Delta C_{VAR}$.

In such a case where "steps" in capacitance are only performed every Nv capacitances, i.e. Nv capacitances have the same capacitance value, the capacitances may be calculated according to $$C_{VAR(n+1)} = C_{VAR(n)} + Nv*(C_{UNIT\_MIN} + n*\Delta C_{VAR}) \quad (6)$$

Again $C_{VAR(0)}$ is set to a constant start, and $C_{UNIT\_MIN}$ the capacitance value of the capacitances in the first block of Nv capacitances. n in equation (6) runs from zero to ymax/Nv, i.e. denotes the number of the block of Nv capacitances. $\Delta C_{var}$ is the capacitor step size from one Nv block to the next block of Nv capacitances. It should be noted that for Nv=1, equation (6) essentially corresponds to equations (4) and (5).

Such a coarser scaling may for example be used if the layout and implementation technique used for a capacitance matrix allow only changes of the capacitances which are larger than $\Delta C_{VAR}$ to equations (4) and (5). In such a case, as mentioned above for example a capacitance step may be introduced every $Nv^{th}$ capacitance, i.e. the first n capacitances are equal, then the next n capacitances are increased by the same amount with respect to the first n capacitances etc., or each capacitances may be given a value which most closely resembles the value according to equations (4) and (5) taking design restrictions into account.

Figure 5:
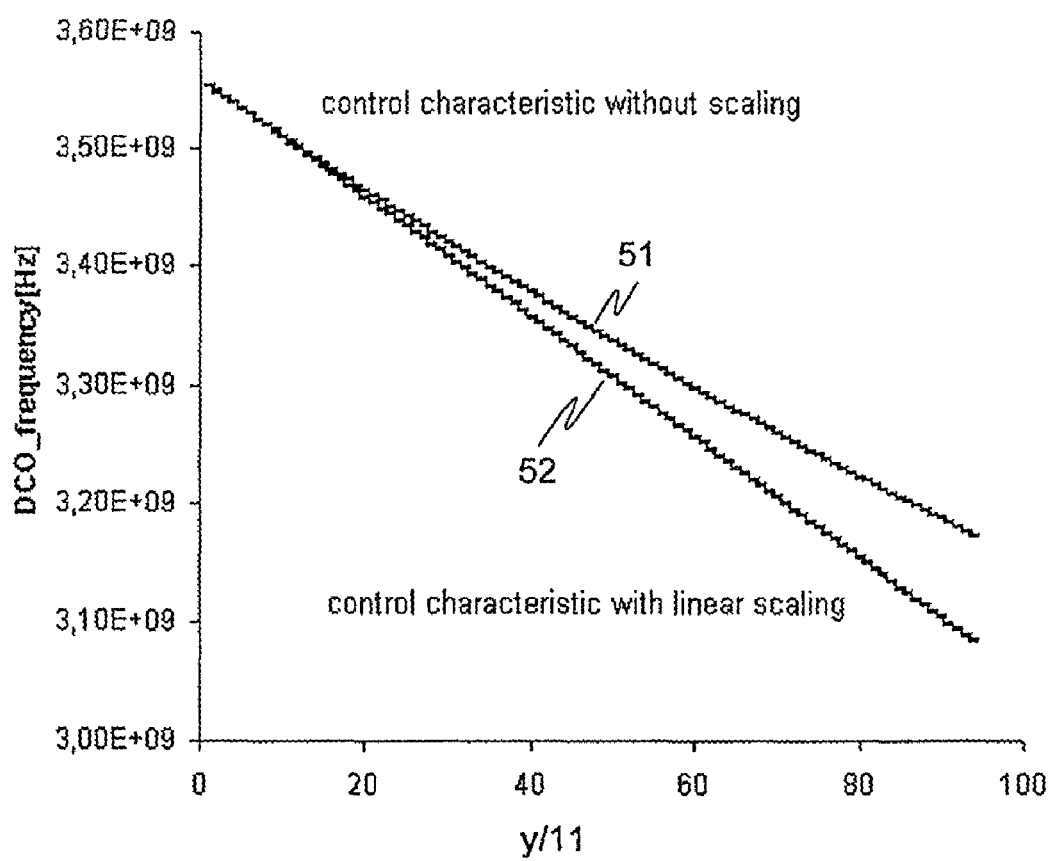
FIG. 5 shows graphs for explaining some features of some embodiments of the present invention.

To illustrate the effect of such a scaling as described by equations (4), (5) and (6), FIG. 5 shows simulation results for a 32×32 capacitance matrix with Nv=11. The frequency of a digitally controlled oscillator is shown depending on the control word y, where in FIG. 5 y divided by 11 is shown, i.e. one step in curves 51, 52 corresponds to 11 unit capacitances being activated or deactivated. Curve 51 shows the behavior without scaling, and curve 52 shows the behavior with linear scaling as defined by equation (6). As can be seen, the linearity is increased through this scaling.

For the simulation, as inductance L a value of 1 nH was chosen, $C_{FIX}$ was set to 2 pF, $C_{VAR1}$ was set to 500 aF, and $\Delta C_{VAR}$ was set to 3 aF.

This linear scaling reduces the non-linearity of the frequency depending on the control word from ±18% to ±2%. With a higher order scaling like cubic scaling, in some embodiments leads to an even more linear behavior.

It should be noted that the above embodiments are to be regarded as examples only. As mentioned, the size and arrangement of the scale capacitance matrix of the embodiments of FIGS. 3 and 4 serves merely as an example, and other sizes and arrangement may equally be used. Moreover, while in the embodiment of FIG. 3 the frequency of the digitally controlled oscillator is controlled by activating and deactivating capacitances in scale capacitance matrix 32, in other embodiments beside a scaled capacitance matrix additional switchable capacitances may be provided for tuning. For example, a scaled capacitance matrix may be used for final tuning, whereas other adjustable or switchable capacitances may be used for course tuning. In other embodiments, additionally or alternatively some bits of a digital control word may be used for controlling the scaled capacitance matrix, for example via thermometer decoding as explained with reference to FIG. 4, other bits may be fed to further capacitances which are scaled in a ratio of 1:2:4 . . . . For example, the least significant bits may be set to such an arrangement.

Therefore, since a plurality of VARiations and deviations are possible, the scope of the present application is not to be limited by the above embodiments, but is intended to be limited only by the appended claims and equivalences thereof.

What is claimed is:

1. An oscillator, comprising:
an array of capacitances, the array of capacitances formed as a matrix of capacitances,
wherein at least some capacitance values associated with the array of capacitances differ in capacitance values;
a thermometer decoder coupled to said array of capacitances, the thermometer decoder including a line decoder and a column decoder, the line decoder associated with thermometer to control activation and deactivation of capacitances associated with one or more rows of the matrix of capacitances, and the column decoder associated with thermometer is to control activation and deactivation of capacitances associated with one or more columns of the matrix of capacitances; and
a digital control input coupled to the thermometer decoder, wherein a number of activated capacitances of the array of capacitances correspond to a number represented by at least part of a digital control word supplied to the digital control input;
a fixed capacitance; and
an inductance, wherein a frequency of an output signal of the oscillator is a function of the fixed capacitance and activated ones of the array of capacitances.

2. The oscillator of claim 1, wherein capacitance values of the array of capacitances increase in value.

3. The oscillator of claim 2, wherein said increasing is essentially linear.

4. An oscillator, comprising:
an array of capacitances,
wherein at least some capacitance values associated with the array of capacitances have different capacitance values, the array of capacitances formed as a matrix of capacitances;
a controller, comprising:
a thermometer controller, the thermometer decoder including a line decoder and a column decoder, the line decoder associated with thermometer to control activation and deactivation of capacitances associated with one or more rows of the matrix of capacitances, and the column decoder associated with thermometer is to control activation and deactivation of capacitances associated with one or more columns of the matrix of capacitances, and
a digital control input coupled to the thermometer controller,
wherein the controller is configured to control activation of capacitances of the array of capacitances based on a digital control word supplied to the digital control input such that a number of activated ones of the array of capacitances corresponds to a number represented by at least part of the digital control word.

5. The oscillator of claim 4, wherein said controller is configured such that the array of capacitances are activated in order of ascending capacitance values.

6. The oscillator of claim 4, wherein the array of capacitances is scaled based on one relationship selected from the group consisting of a linear relationship, a quadratic relationship and a cubic relationship.

7. A phase locked loop, comprising:
a phase detector;
a loop filter downstream of the phase detector;
a digitally controlled oscillator downstream of said loop filter;
wherein an output of said digitally controlled oscillator is coupled with an input of said phase detector, and
wherein the digitally controlled oscillator includes a fixed capacitance and an inductance and wherein further a frequency of an output signal of the oscillator are a function of the fixed capacitance and activated ones of the array of capacitances,
wherein said digitally controlled oscillator comprises an array of capacitances and a thermometer decoder coupled to the array of capacitances, the array of capacitances formed as a matrix of capacitances, wherein at least some capacitance values associated with the array of capacitances differ in capacitance values, the thermometer decoder including a line decoder and a column decoder, the line decoder associated with thermometer to control activation and deactivation of capacitances associated with one or more rows of the matrix of capacitances, and the column decoder associated with thermometer is to control activation and deactivation of capacitances associated with one or more columns of the matrix of capacitances;
a digital control input coupled to the thermometer decoder,
wherein activated ones of the array of capacitances correspond in number to a number represented by at least part of a digital control word supplied to the digital control input.

8. The phase locked loop of claim 7, wherein capacitance values of the array of capacitances increase in value.

9. The phase locked loop of claim 8, wherein said increasing is essentially linear.

10. The phase locked loop of claim 7, further comprising a mixer coupled with an output of said digitally controlled oscillator.

11. The phase locked loop of claim 7, further comprising a frequency divider coupled between said output of said digitally controlled oscillator and said input of said phase detector, said frequency divider comprising a modulation input.

* * * * *